US012813014B2

(12) United States Patent
Ke et al.

(10) Patent No.: US 12,813,014 B2
(45) Date of Patent: Nov. 24, 2026

(54) LIGHT EMITTING DIODE AND LIGHT EMITTING DEVICE

(71) Applicant: Quanzhou sanan semiconductor technology Co., Ltd., Fujian (CN)

(72) Inventors: Hanqing Ke, Fujian (CN); Min Huang, Fujian (CN); Yu-Tsai Teng, Fujian (CN); Yaowei Chuang, Fujian (CN); Chia-Wen Wu, Fujian (CN); Ruiqing Liang, Fujian (CN); Xin Hu, Fujian (CN); Linwei Ke, Fujian (CN)

(73) Assignee: Quanzhou sanan semiconductor technology Co., Ltd., Fujian (CN)

( * ) Notice: Subject to any disclaimer, the term of this patent is extended or adjusted under 35 U.S.C. 154(b) by 422 days.

(21) Appl. No.: 18/604,376

(22) Filed: Mar. 13, 2024

(65) Prior Publication Data

US 2024/0387773 A1 Nov. 21, 2024

(30) Foreign Application Priority Data

May 15, 2023 (CN) ......................... 202310545138.9

(51) Int. Cl.
*H10H 20/819* (2025.01)
*H10H 20/01* (2025.01)

(52) U.S. Cl.
CPC ......... *H10H 20/819* (2025.01); *H10H 20/018* (2025.01)

(58) Field of Classification Search
None
See application file for complete search history.

(56) References Cited

U.S. PATENT DOCUMENTS

2023/0145322 A1* 5/2023 Lee ...................... H01G 4/1227
361/301.4

* cited by examiner

*Primary Examiner* — Anthony Ho
(74) *Attorney, Agent, or Firm* — JCIPRNET

(57) ABSTRACT

A light emitting diode includes a substrate and a semiconductor light emitting stack layer. The semiconductor light emitting stack layer is disposed on the substrate, and the substrate has four sidewalls, an upper surface, and a lower surface. At least one sidewall is provided with a first laser dotting region and a second laser dotting region. The first laser dotting region includes first laser dots, and the second laser dotting region includes second laser dots. A stress crack is present between the first laser dotting region and the second laser dotting region. A first distance D1 is present between the first laser dotting region and the stress crack, a second distance D2 is present between the second laser dotting region and the stress crack, and 0.7D2<D1<1.3D2.

15 Claims, 5 Drawing Sheets

LIGHT EMITTING DIODE AND LIGHT EMITTING DEVICE

CROSS-REFERENCE TO RELATED APPLICATION

This application claims the priority benefit of China application serial no. 202310545138.9, filed on May 15, 2023. The entirety of the above-mentioned patent application is hereby incorporated by reference herein and made a part of this specification.

BACKGROUND

Technical Field

The disclosure relates to the field of semiconductor manufacturing technology, and particularly, to a light emitting diode and a light emitting device.

Related Art

The light emitting diode (LED) is a semiconductor light emitting component that is generally made of semiconductor such as GaN, GaAs, GaP, GaAsP, etc. and has a core being a PN junction with light emitting properties. LEDs have advantages of a high luminous intensity, a high efficiency, a small size, and a long service life, and are currently considered one of the most promising light sources. LEDs have been widely used in fields such as lighting, monitoring and command, high-definition broadcasting, high-end cinemas, office displays, conference interactions, virtual reality, etc.

In the process of manufacturing LED chips, it is common in the industry to simultaneously form a series of laser scribes of different depths inside a sapphire substrate of a LED wafer by laser stealth cutting, and then start cutting the LED wafer by breaking into multiple single LED chips on the upper or lower surface of the substrate formed with the laser scribes. As shown in FIG. 1, currently, when cutting LED chips, this series of laser scribes of different depths are formed at the same time by a single knife with multiple focuses, and a transverse stress crack 3 is formed between adjacent laser scribes of different depths. The stress crack 3 deviates significantly upward as a whole. Particularly, the stress crack 3 at two ends (located at the edges of the sidewall) deviates more significantly upward, which causes zigzagged sidewalls at the chip edges, i.e., significant unevenness at the sidewalls, and leads to excessive local brightness, and excessive local brightness causes the chip to fail the AOI. The so-called AOI refers to an inspection in which the chip is irradiated with a beam to determine whether the chip is non-defective according to an intensity of light reflected from different positions of the chip. If the chip is excessively bright locally, it is determined as defective. In addition, since an expansion crack 2 of a second depth will suppress an expansion crack 1 of a first depth, this will also cause the sidewall of the sapphire substrate to be uneven, which in turn leads to formation of wavy back surface edges of the LED chip (as shown in FIG. 2), reduces the quality of the LED chip, and increases the defect rate.

It should be noted that the information disclosed in the background section is only intended to enhance the overall understanding of the background of the disclosure, and should not be regarded as an acknowledgment or implication in any form that this information constitutes prior art known to those ordinarily skilled in the field.

SUMMARY

The disclosure provides a light emitting diode including a substrate and a semiconductor light emitting stack layer. The semiconductor light emitting stack layer is disposed on the substrate, and the substrate has four sidewalls, an upper surface, and a lower surface. At least one of the four sidewalls is provided with a first laser dotting region and a second laser dotting region. The first laser dotting region includes a plurality of first laser dots, and the second laser dotting region includes a plurality of second laser dots. A stress crack is present between the first laser dotting region and the second laser dotting region. A first distance D1 is present between the first laser dotting region and the stress crack, a second distance D2 is present between the second laser dotting region and the stress crack, and 0.7D2<D1<1.3D2. By defining the stress crack at a position relatively central between the first laser dotting region and the second laser dotting region, it is possible to effectively prevent formation of zigzagged sidewalls and wavy back surface edges in the light emitting diode to improve the quality of the light emitting diode and increase the product yield.

In some embodiments, the sidewalls of the substrate include difficult-to-crack sidewalls and easy-to-crack sidewalls, the difficult-to-crack sidewall is connected to the easy-to-crack sidewall, the first laser dotting region includes a plurality of first laser dots, the second laser dotting region includes a plurality of second laser dots, a spacing between the plurality of first laser dots on the difficult-to-crack sidewall is smaller than a spacing between the plurality of first laser dots on the easy-to-crack sidewall, and a spacing between the plurality of second laser dots on the difficult-to-crack sidewall is smaller than a spacing between the plurality of second laser dots on the easy-to-crack sidewall. Accordingly, it is possible to reduce the difficulty in cracking of the difficult-to-crack surface to ensure that the difficult-to-crack surface can crack normally and ensure the quality of the light emitting diode. Optionally, the difficult-to-crack sidewall is perpendicular to the easy-to-crack sidewall.

In the related art, at the easy-to-crack sidewall, when a part of the energy of the second laser dotting region close to the lower surface of the substrate is transmitted to the lower surface of the substrate, a considerable part of the energy is transmitted back toward the upper surface of the substrate and converges with the energy of the first laser dotting region. Thus, the crack generated from the second laser dot will suppress the longitudinal crack at the first laser dot, which causes D1<0.7D2 and in turn leads to adverse effects such as formation of wavy appearances. Considering the above, in some embodiments, by controlling the first distance D1 and the second distance D2 located on the easy-to-crack sidewall to satisfy the following condition: 0.7D2<D1<1.3D2, it is possible to effectively prevent formation of zigzagged sidewalls and wavy back surface edges to form relatively smooth sidewalls, and it is possible to prevent excessive local brightness of the light emitting diode.

In some embodiments, the first laser dotting region has a first expansion crack, the second laser dotting region has a second expansion crack, the first expansion crack extends from the first laser dot toward the upper surface and the lower surface of the substrate, the second expansion crack extends from the second laser dot toward the upper surface and the lower surface of the substrate, and extension ends of the first expansion crack and the second expansion crack end at the stress crack.

In some embodiments, viewed from above the light emitting diode toward the substrate, the substrate has long side edges and short side edges, the easy-to-crack sidewalls are located at the long side edges, and the difficult-to-crack sidewalls are located at the short side edges. Considering that wavy appearances on the side of the long side edge would have a greater impact on the quality of the light emitting diode, the easy-to-crack sidewall is located at the long side edge, and the difficult-to-crack sidewall is located at the short side edge.

In some embodiments, the plurality of second laser dots and the plurality of first laser dots are provided in a staggered arrangement. Optionally, projections of the plurality of first laser dots on a horizontal plane do not overlap with projections of the plurality of second laser dots on the horizontal plane. Accordingly, excessive energy due to the second laser dot and the first laser dot being in the same vertical direction, which causes further overlapping of the generated expansion cracks and thus damages the quality of the light emitting diode can be prevented.

In some embodiments, a third distance D3 is present between the first laser dotting region and the upper surface of the substrate, a fourth distance D4 is present between the second laser dotting region and the lower surface of the substrate, and D3 is greater than D4, so that the upwardly expanding cracks are provided with a sufficient region to protect the epitaxy from crack damage.

In some embodiments, the first distance D1 and the second distance D2 satisfy the following condition: $0.9D2<D1<1.1D2$.

In some embodiments, the light emitting diode further includes a first electrode and a second electrode, the semiconductor light emitting stack layer includes a first semiconductor layer, a light emitting layer, and a second semiconductor layer sequentially stacked on the substrate, the first electrode is electrically connected to the first semiconductor layer, and the second electrode is electrically connected to the second semiconductor layer.

In some embodiments, an edge length of the light emitting diode is less than or equal to 250 μm.

In some embodiments, the substrate has a thickness H1, and $50\ \mu m \leq H1 \leq 200\ \mu m$.

In some embodiments, the substrate is a sapphire substrate.

The disclosure further provides a light emitting device including the light emitting diode provided according to any of the above embodiments.

In the light emitting diode and the light emitting device provided according to an embodiment of the disclosure, by defining the stress crack at a position relatively central between the first laser dotting region and the second laser dotting region, it is possible to effectively prevent formation of zigzagged sidewalls and wavy back surface edges in the light emitting diode to improve the quality of the light emitting diode and increase the product yield.

Other features and beneficial effects of the disclosure will be elaborated on in the description below, and some technical features and beneficial effects can be obviously derived from the description, or can be understood through the implementation of the disclosure.

BRIEF DESCRIPTION OF DRAWINGS

In order to more clearly illustrate the technical solutions in the embodiments of the disclosure or in the related art, a brief introduction of the drawings required in the description of the embodiments or the related art will be given below. Obviously, some of the drawings in the following description relate to some embodiments of the disclosure. For those skilled in the art, other drawings may be obtained based on these drawings without creative effort.

DESCRIPTION OF EMBODIMENTS

Figure 1:
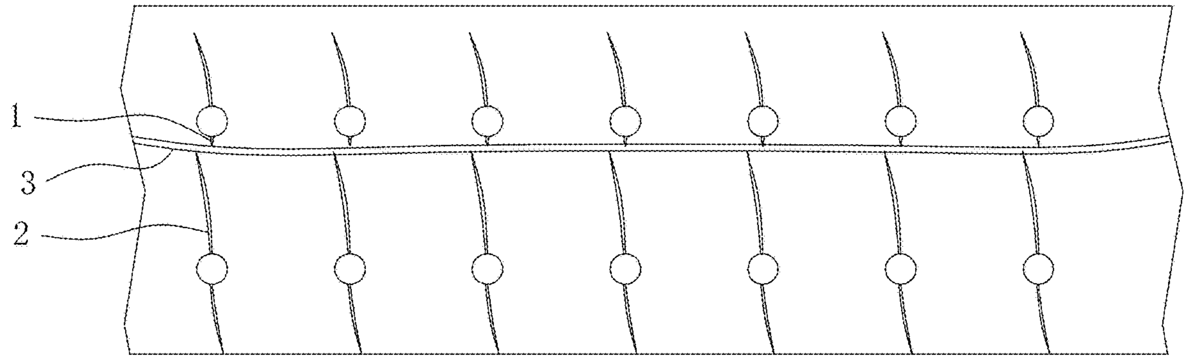
FIG. 1 (PRIOR ART)
FIG. 1 is a schematic diagram of a conventional LED chip at a cutting stage.

To make the objectives, technical solutions, and advantages of the embodiments of the disclosure clearer, the technical solutions in the embodiments of the disclosure will be clearly and comprehensively described with reference to the drawings in the embodiments of the disclosure. Obviously, the described embodiments form a part of the embodiments of the disclosure rather than all of the embodiments. The technical features provided in different embodiments of the disclosure described below may be combined with each other as long as they do not conflict with each other. All other embodiments obtained by those skilled in the art based on the embodiments in the disclosure without making creative efforts fall within the scope of protection of the disclosure.

In the description of the disclosure, it should be understood that terms such as “center”, “transverse”, “up”, “down”, “left”, “right”, “vertical”, “horizontal”, “top”, “bottom”, “inside”, “outside”, etc. indicate orientations or positional relationships based on the orientations or positional relationships shown in the drawings. Such terms only serve to facilitate description of the disclosure and simplify the description and do not indicate or imply that the referred device or component must have a specific orientation or must be constructed and operated in a specific orientation, so such terms should not be construed as limiting the disclosure. In addition, terms such as “first”, “second”, etc. only serve descriptive purposes and should not be construed as indicating or implying relative importance or implicitly indicating the quantity of the referred technical feature. Thus, a feature described with “first”, “second”, etc. may explicitly or implicitly include one or more of such features. In the description of the disclosure, unless otherwise specified, the meaning of “plurality/multiple” is two or more. Furthermore, the terms “comprise/include” and their variants all mean “at least comprise/include”.

Figure 3:
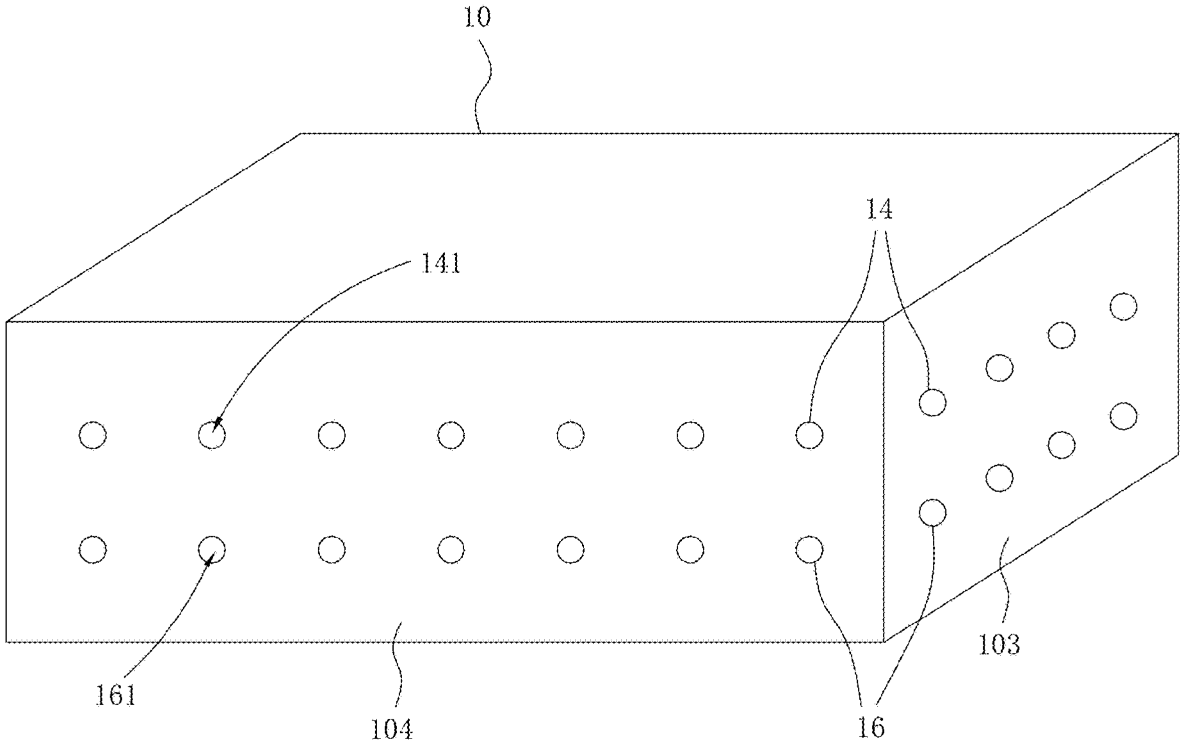
FIG. 3 is a schematic diagram showing cutting of lateral surfaces of a substrate provided according to an embodiment of the disclosure.
Figure 4:
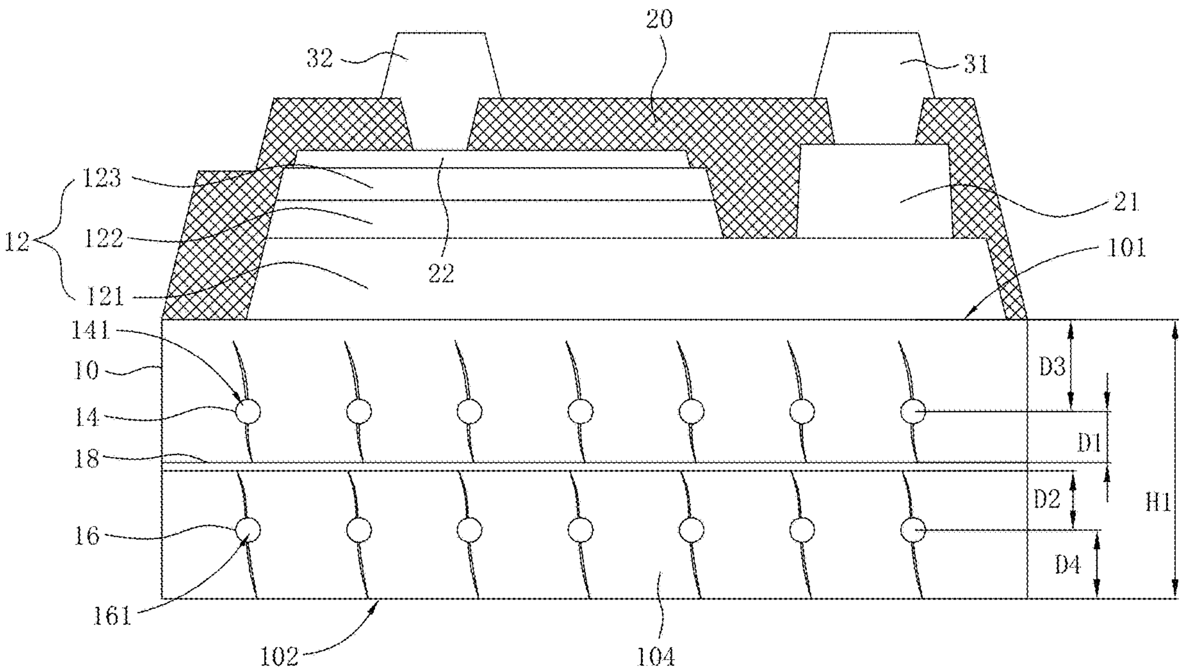
FIG. 4 is a schematic structure diagram of a light emitting diode provided according to an embodiment of the disclosure.
Figure 5:
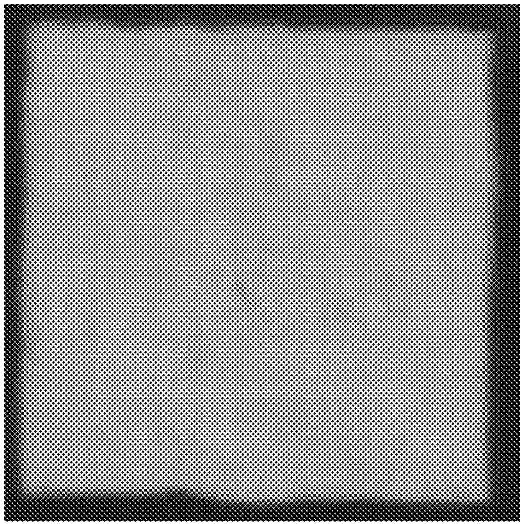
FIG. 5 is a schematic diagram of a back surface of a light emitting diode provided according to an embodiment of the disclosure.

Referring to FIG. 3, FIG. 4, and FIG. 5, FIG. 3 is a schematic diagram showing cutting of lateral surfaces of a substrate 10 provided according to an embodiment of the disclosure, FIG. 4 is a schematic structure diagram of a light emitting diode provided according to an embodiment of the disclosure, and FIG. 5 is a schematic diagram of a back surface of a light emitting diode provided according to an embodiment of the disclosure. To achieve at least one of the aforementioned advantages or other advantages, an embodiment of the disclosure provides a light emitting diode. As shown in the figures, the light emitting diode includes a substrate 10 and a semiconductor light emitting stack layer 12.

The substrate 10 may be an insulating substrate, and optionally, the substrate 10 may be made of a transparent material or a semi-transparent material. In the illustrated embodiment, the substrate 10 is a sapphire substrate. In some embodiments, the substrate 10 may be a patterned sapphire substrate, but the disclosure is not limited thereto. The substrate 10 may also be made of a conductive material or a semiconductor material. For example, the material of the substrate 10 may include at least one of silicon carbide, silicon, magnesium aluminum oxide, magnesium oxide, lithium aluminum oxide, aluminum gallium oxide, and gallium nitride. Optionally, a thickness H1 of the substrate 10 falls in a range of 50 μm≤H1≤200 μm.

The semiconductor light emitting stack layer 12 is disposed on an upper surface 101 of the substrate 10. The semiconductor light emitting stack layer 12 includes a first semiconductor layer 121, a light emitting layer 122, and a second semiconductor layer 123 that are sequentially stacked on the substrate 10. That is, the light emitting layer 122 is located between the first semiconductor layer 121 and the second semiconductor layer 123.

The first semiconductor layer 121 may be an N-type semiconductor layer, which may provide electrons to the light emitting layer 122 under the action of a power source. In some embodiments, the first semiconductor layer 121 includes an N-type doped nitride layer. The N-type doped nitride layer may include N-type impurities. The N-type impurities may include one or a combination of Si, Ge, and Sn.

The light emitting layer 122 may be a quantum well (QW) structure. In some embodiments, the light emitting layer 122 may also be a multiple quantum well (MQW) structure, which includes multiple quantum well layers and multiple quantum barrier layers disposed alternately and repetitively. For example, the multiple quantum well structure may be GaN/AlGaN, InAlGaN/InAlGaN, or InGaN/AlGaN. In addition, the composition and thickness of the well layers in the light emitting layer 122 determine the wavelength of the light generated. The light emitting efficiency of the light emitting layer 122 may be improved by changing the depth of the quantum well layer in the light emitting layer 122, the number and thickness of the paired quantum well layer and quantum barrier layer, and/or other features.

The second semiconductor layer 123 may be a P-type semiconductor layer, which may provide electron holes to the light emitting layer 122 under the action of a power source. In some embodiments, the second semiconductor layer 123 includes a P-type doped nitride layer. The P-type doped nitride layer may include one or more P-type impurities. The P-type impurities may include one or a combination of Mg, Zn, and Be. The second semiconductor layer 123 may be a single-layer structure or may be a multi-layer structure having different compositions. In addition, the configuration of the epitaxial structure is not limited thereto, and other types of epitaxial structures may also be selected according to actual requirements.

The substrate has four sidewalls, and at least one of the four sidewalls is provided with a first laser dotting region 14 and a second laser dotting region 16. The first laser dotting region 14 includes a plurality of first laser dots 141, and the second laser dotting region 16 includes a plurality of second laser dots 161. Laser dot stealth cutting is performed from the first laser dot 141 and the second laser dot 161. Expansion cracks are formed at the first laser dot 141 and the second laser dot 161 to extend both upward and downward. A first expansion crack extends from the first laser dot 141 toward the upper surface 101 and the lower surface 102 of the substrate 10, and a second expansion crack extends from the second laser dot 161 toward the upper surface 101 and the lower surface 102 of the substrate 10. A stress crack 18 is formed at the intersection between the first expansion cracks extending downward from the first laser dots 141 and the second expansion cracks extending upward from the second laser dots 161. That is, a stress crack 18 is formed between the first laser dotting region 14 and the second laser dotting region 16, and the extension ends of the first expansion cracks and the second expansion cracks end at the stress crack 18. A first distance D1 is present between the first laser dotting region 14 and the stress crack 18, and a second distance D2 is present between the second laser dotting region 16 and the stress crack 18. By defining the stress crack 18 at a relatively central position between the first laser dotting region 14 and the second laser dotting region 16, i.e., 0.7D2<D1<1.3D2, it is possible to effectively prevent formation of zigzagged sidewalls and wavy back surface edges in the light emitting diode to form relatively smooth vertical sidewalls. Also, it is possible to prevent excessive local brightness of the light emitting diode to ensure the quality of the light emitting diode.

Figure 2:
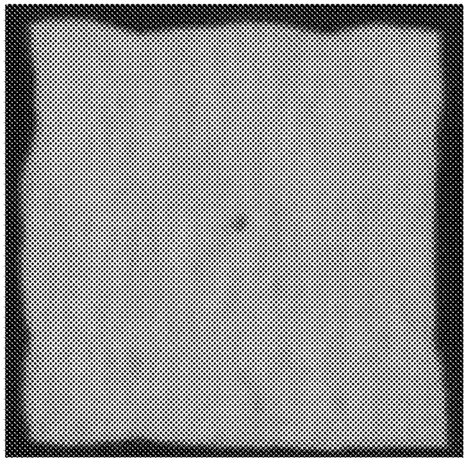
FIG. 2 (PRIOR ART)
FIG. 2 is a schematic diagram of a back surface of the conventional LED chip.

The stress crack of the disclosure may be formed by adjusting the power, spacing, and time interval of the first laser dot 141 and the second laser dot 161. As an exemplary embodiment, the time of forming an initial first laser dot 141 in the first laser dotting region 14 is at least 30 s (30 seconds) apart from the time of forming an initial second laser dot 161 in the second laser dotting region 16. Furthermore, the time of forming an Nth first laser dot 141 in the first laser dotting region 14 is at least 30 s apart from the time of forming an Nth second laser dot 161 in the second laser dotting region 16, where N is greater than or equal to 2 and is a positive integer. After a first laser dot 141 is formed, energy begins to release upward and downward inside the substrate 10 to form cracks. When a second laser dot 161 is formed after an interval of 30*s*, more than half of the energy at the first laser dot 141 has been released, so the crack formed by the energy released from the second laser dot 161 will not suppress the crack of the first laser dot 141. Thus, the stress crack 18 can be located at a central position (without forming a transverse stress crack at a position toward the upper side as in the related art), i.e., at a position satisfying 0.7D2<D1<1.3D2. Accordingly, it is possible to reduce damage of the expansion cracks to the substrate 10 and ensure neatness of the surfaces of the substrate 10. Comparing FIG. 2 and FIG. 5, in this exemplary embodiment, it is possible to effectively prevent formation of zigzagged sidewalls and wavy back surface edges in the light emitting diode to form relatively smooth vertical sidewalls, and it is possible to prevent excessive local brightness of the light emitting diode to ensure the quality of the light emitting diode and reduce the defect rate. To further reduce the damage of the expansion cracks to the substrate 10 and ensure the neatness of the sidewalls and back surface of the substrate 10, the first distance D1 and the second distance D2 satisfy the following condition: 0.9D2<D1<1.1D2.

Under normal circumstances, the stress crack 18 appears as a horizontal line segment. In that case, the first distance D1 refers to a vertical distance from the first laser dot 141 to the stress crack 18. Similarly, the second distance D2 refers to a vertical distance from the second laser dot 161 to the stress crack 18. However, considering the effect of actual process errors, there are also cases where the stress crack 18 is not an absolute horizontal line segment. The first distance D1 may refer to a longitudinal vertical distance from the first laser dotting region 14 to the stress crack 18, and D1 may be calculated according to an average of the longitudinal vertical distances from the center position of each laser dot in the first laser dotting region 14 to the stress crack 18. Preferably, a minimum value is selected from a plurality of longitudinal vertical distances from the center position of each laser dot in the first laser dotting region 14 to the stress crack 18 to serve as D1, and all the measured longitudinal vertical distances satisfy 0.7D2<D1<1.3D2. Similarly, the second distance D2 may also be obtained according to the above calculation method. In addition, in some cases, D2 may also be obtained by subtracting the D1 value from a vertical distance between the center position of the corresponding first laser dot 141 and the center position of the corresponding second laser dot 161. Furthermore, in some cases, D1 may also be obtained by subtracting the D2 value from the vertical distance between the center position of the corresponding first laser dot 141 and the center position of the corresponding second laser dot 161.

In the disclosure, taking the entire stress crack 18 present between the first laser dotting region 14 and the second laser dotting region 16 as a reference, in a region in which the stress crack 18 of any position is located, the first distance D1 and the second distance D2 satisfy the following condition: 0.7D2<D1<1.3D2. Accordingly, it is possible to effectively prevent formation of zigzagged sidewalls and wavy back surface edges in the light emitting diode to form relatively smooth vertical sidewalls, and it is possible to prevent excessive local brightness of the light emitting diode to ensure the quality of the light emitting diode and reduce the defect rate.

As an embodiment, in a region in which the stress crack 18 of the entire length of the disclosure is located, the first distance D1 and the second distance D2 satisfy the following condition: 0.7D2<D1<1.3D2.

As an embodiment, D1>D2, the spacing range between two adjacent first laser dots 141 is 4 to 20 micrometers, and the spacing range between two adjacent second laser dots 161 is 4 to 20 micrometers.

As an embodiment, the first laser dotting region 14 is closer to the upper surface 101 of the substrate 10 than the second laser dotting region 16, and both the first laser dotting region 14 and the second laser dotting region 16 are parallel to the upper surface 101 or the lower surface 102 of the substrate 10.

A third distance D3 is present between the first laser dotting region 14 and the upper surface 101 of the substrate 10, and a fourth distance D4 is present between the second laser dotting region 16 and the lower surface 102 of the substrate 10. To further protect the epitaxy from crack damage, the third distance D3 is controlled to be greater than the fourth distance D4, so that the upwardly expanding cracks are provided with a sufficient region to protect the epitaxy from crack damage.

As an embodiment, the four sidewalls of the substrate 10 include two difficult-to-crack sidewalls 103 and two easy-to-crack sidewalls 104 (FIG. 4 shows the easy-to-crack sidewall 104). The difficult-to-crack sidewall 103 is adjacent to the easy-to-crack sidewall 104, the difficult-to-crack sidewall 103 is connected to the easy-to-crack sidewall 104, and the difficult-to-crack sidewall 103 is located on one side of the easy-to-crack sidewall 104. Considering that the difficult-to-crack sidewalls 103 are more resistant to cracking than the easy-to-crack sidewalls 104, the spacing between the plurality of first laser dots 141 on the difficult-to-crack sidewall 103 is smaller than the spacing between the plurality of first laser dots 141 on the easy-to-crack sidewall 104, and the spacing between the plurality of second laser dots 161 on the difficult-to-crack sidewall 103 is smaller than the spacing between the plurality of second laser dots 161 on the easy-to-crack sidewall 104. That is, the spacing between the laser dots on the difficult-to-crack sidewall 103 is smaller than the spacing between the laser dots on the easy-to-crack sidewall 104 to ensure that the difficult-to-crack surface can crack normally and ensure the quality of the light emitting diode. The so-called spacing refers to the spacing between the center positions of adjacent laser dots.

In the related art, at the easy-to-crack sidewall 104, when a part of the energy of the second laser dotting region 16 close to the lower surface 102 of the substrate 10 is transmitted to the lower surface 102 of the substrate 10, a considerable part of the energy is transmitted in the upward direction and converges with the energy of the first laser dotting region 14. Thus, the longitudinal crack generated upward from the second laser dot 161 will suppress the longitudinal cracks transmitted downward from the first laser dot 141, which causes D1<0.7D2 and in turn leads to adverse effects such as formation of zigzagged sidewalls, wavy appearances, etc.

Considering the above, in the disclosure, by controlling the first distance D1 and the second distance D2 located on the easy-to-crack sidewall 104 to satisfy the following condition: 0.7D2<D1<1.3D2, it is possible to effectively prevent adverse effects such as wavy appearances. On the difficult-to-crack sidewall 103, the directionality of laser energy transmission is poorer. In contrast, on the easy-to-crack sidewall 104, the laser energy is transmitted along the crystal plane, so the stress crack 18 formed on the easy-to-crack sidewall 104 is more obvious.

The light emitting diode further includes a first electrode 21, a second electrode 22, an insulating layer 20, a first solder pad 31, and a second solder pad 32.

The first electrode 21 is electrically connected to the first semiconductor layer 121, and the material of the first electrode 21 may be a combination of metals such as Cr, Pt, Au, Ti, Ni, Al, etc. Preferably, the electrode is a multi-layer structure, and its surface layer may be made of Au material.

The second electrode 22 is electrically connected to the second semiconductor layer 123, and the material of the second electrode 22 may be a combination of metals such as Cr, Pt, Au, Ti, Ni, Al, etc. Preferably, the electrode is a multi-layer structure, and its surface layer may be made of Au material.

The insulating layer 20 covers the semiconductor light emitting stack layer 12, the first electrode 21, and the second electrode 22, and forms openings above the first electrode 21 and the second electrode 22. The insulating layer 20 has different effects depending on the location concerned. For example, when the insulating layer 20 covers the sidewall of the epitaxial structure, it may serve to prevent electrical connection between the first semiconductor layer 121 and the second semiconductor layer 123 due to leakage of conductive material and thus may reduce a short-circuit abnormality of the light emitting diode, but the embodiment of the disclosure is not limited thereto. The material of the insulating layer 20 includes a non-conductive material. The non-conductive material may optionally be an inorganic material or a dielectric material. The inorganic material may include silicone gel. The dielectric material includes electrically insulating materials such as aluminum oxide, silicon nitride, silica, titanium oxide, or magnesium fluoride. For example, the insulating layer 20 may be silicon dioxide, silicon nitride, titanium oxide, tantalum oxide, niobium oxide, barium titanate, or a combination thereof, and the combination may be, for example, a Bragg reflector (DBR) formed by repeatedly stacking two materials with different refractive indices.

The first solder pad 31 and the second solder pad 32 are disposed on the insulating layer 20 and are respectively electrically connected to the first electrode 21 and the second electrode 22 via the openings of the insulating layer 20. The first solder pad 31 and the second solder pad 32 may be metal solder pads and may be formed at the same time using the same material in the same process, so they may have the same layer structure.

Figure 6:
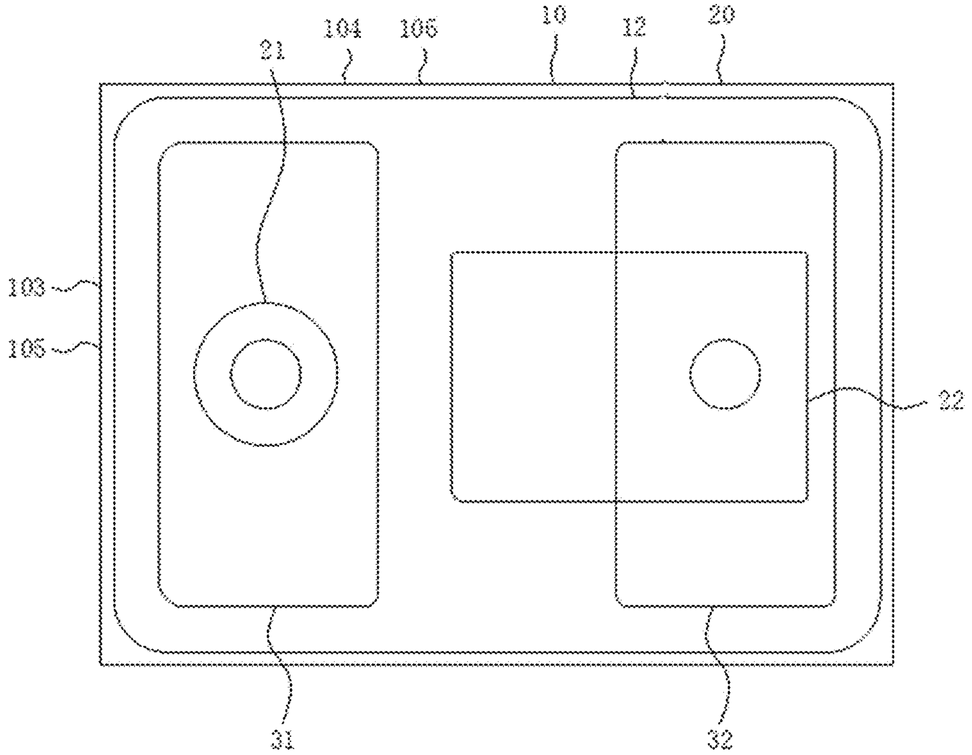
FIG. 6 is a schematic top view of the light emitting diode provided according to an embodiment of the disclosure.

In some embodiments, as shown in FIG. 6, when viewed from above the light emitting diode toward the substrate 10, the substrate 10 has a long side edge 106 and a short side edge 105. The long side edge 106 may be connected to the short side edge 105, and the long side edge 106 may be perpendicular to the short side edge 105. Considering that zigzagged sidewalls and wavy appearances on the side of the long side edge 106 would have a greater impact on the quality of the light emitting diode, the easy-to-crack sidewall 104 is located at the long side edge 106, and the difficult-to-crack sidewall 103 is located at the short side edge 105.

The edge length of the light emitting diode is less than 250 μm. For example, the short side edge 105 or the long side edge 106 is less than 250 μm. Particularly, as the size of light emitting diodes is now becoming smaller, the thickness of light emitting diodes is also becoming smaller, and the area ratio of the four surface edges of the light emitting diode is becoming larger. How to cut the edges of the light emitting diode so that abnormalities such as wavy edges do not occur to thus improve the product yield and reliability is an urgent issue to be solved. In the disclosure, by the staggered-time dotting stealth cutting technology, the stress crack 18 is defined at a position relatively central ($0.7D2<D1<1.3D2$) between the first laser dotting region 14 and the second laser dotting region 16. Accordingly, it is possible to effectively prevent formation of zigzagged sidewalls and wavy back surface edges in the light emitting diode to improve the quality of the light emitting diode and increase the product yield.

Figure 7:
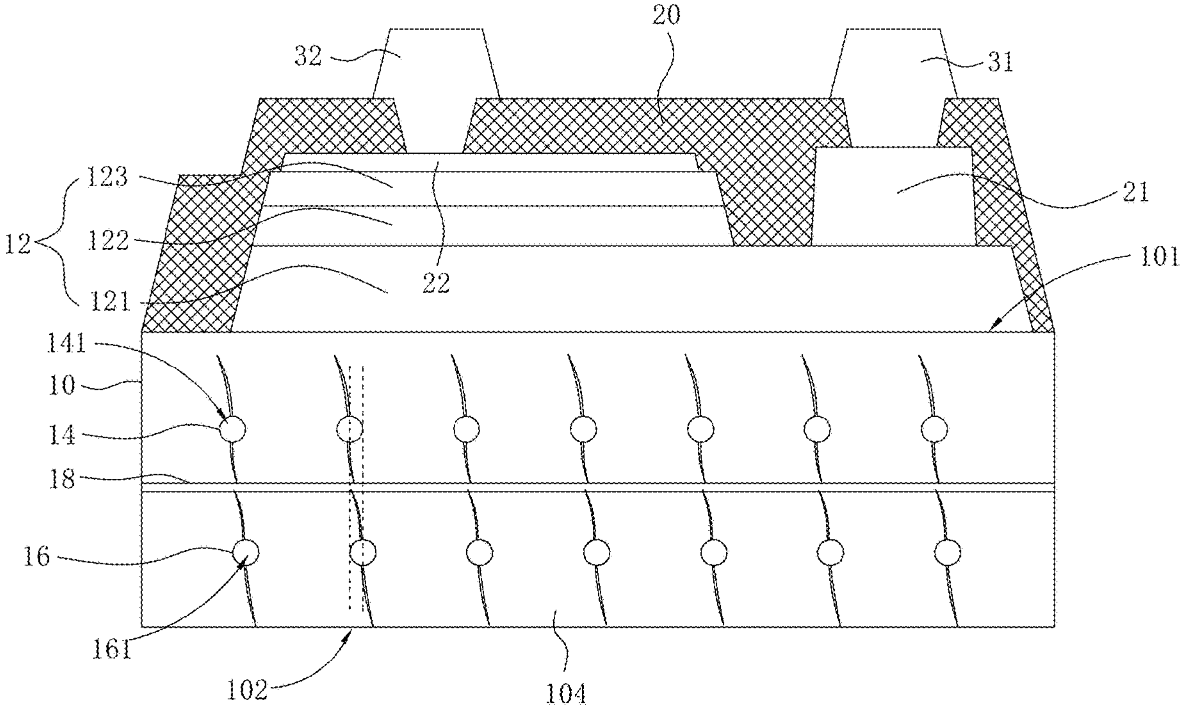
FIG. 7 is a schematic structure diagram of the light emitting diode provided according to another embodiment of the disclosure.
Figure 8:
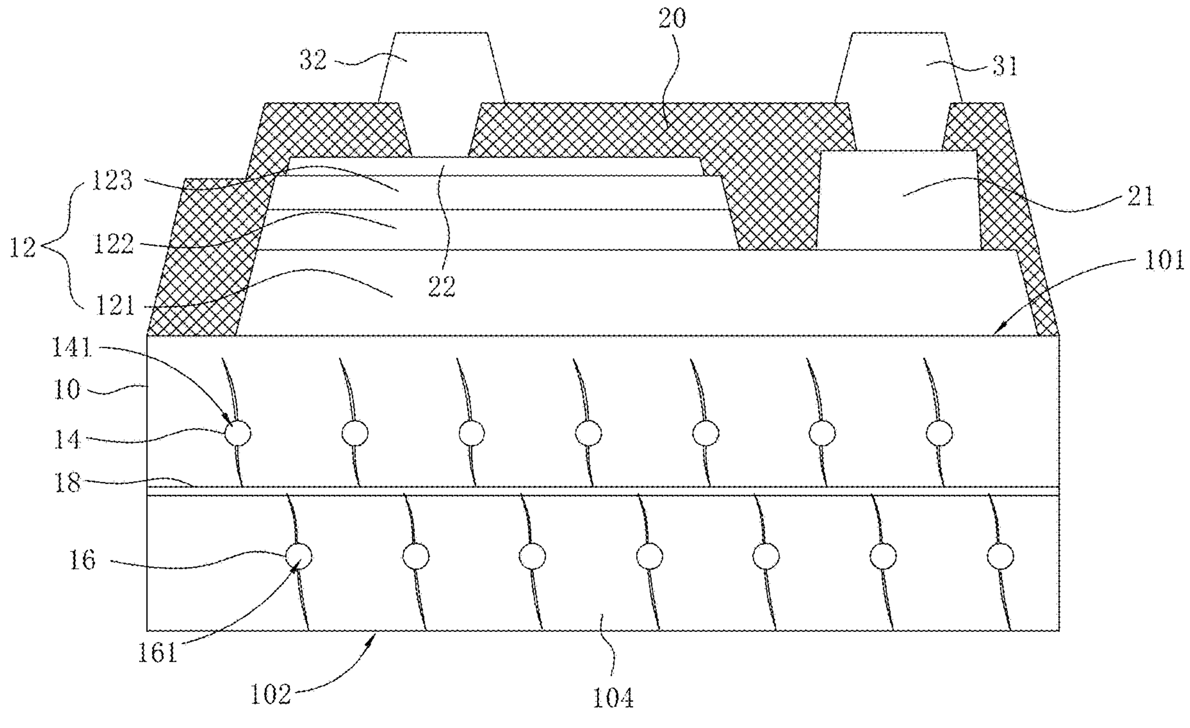
FIG. 8 is a schematic structure diagram of the light emitting diode provided according to another embodiment of the disclosure.

In some embodiments, as shown in FIG. 7, on the easy-to-crack sidewall 104, the plurality of second laser dots 161 and the plurality of first laser dots 141 are provided in a staggered arrangement. This staggered arrangement may be deviating upper and lower parts by a distance of half a laser dot width. That is, a longitudinal vertical broken line passing through the center of the second laser dot 161 and a longitudinal vertical broken line passing through the center of the first laser dot 141 are spaced apart by a distance of half the transverse width of a laser dot. By providing the second laser dot 161 and the first laser dot 141 in an arrangement staggered on upper and lower sides, excessive energy due to the second laser dot 161 and the first laser dot 141 being in the same vertical direction, which causes further overlapping of the expansion cracks, thus causes damage by the extension of the expansion cracks to the epitaxy, and ultimately reduces the quality of the light emitting diode or even directly leads to abnormalities such as a lighting failure can be prevented. Optionally, as shown in FIG. 8, the second laser dot 161 and the first laser dot 141 are completely staggered. That is, projections of the plurality of first laser dots 141 on the horizontal plane and projections of the plurality of second laser dots 161 on the horizontal plane do not overlap at all, which can further prevent damage by the extension of the expansion cracks to the epitaxy and ensure the quality of the light emitting diode.

It should be noted that the laser dots and the transverse stress crack 18 on the sidewall of the substrate 10 may be observed with an optical microscope (OM), and the topology at the sidewall of the substrate 10 may also be presented with a scanning electron microscope (SEM). Defective light emitting diodes may be confirmed based on AOI recognition technology.

The disclosure further provides a light emitting device, which adopts the light emitting diode provided according to any of the above embodiments.

In the light emitting diode and the light emitting device provided according to an embodiment of the disclosure, by defining the stress crack 18 at a position relatively central between the first laser dotting region 14 and the second laser dotting region 16, it is possible to effectively prevent formation of zigzagged sidewalls and wavy back surface edges in the light emitting diode to improve the quality of the light emitting diode and increase the product yield.

Furthermore, those skilled in the art should understand that, although there are many issues in the related art, each embodiment or technical solution of the disclosure may only be improved in one or several aspects, and it is not necessary to solve all the technical problems mentioned in the related art or background section at the same time. Those skilled in the art should understand that content not mentioned in a claim should not be considered as a limitation on that claim.

Finally, it should be noted that the above embodiments are only intended to illustrate, rather than limit, the technical solutions of the disclosure. Although the disclosure has been described in detail with reference to the foregoing embodiments, those skilled in the art should understand that they may still modify the technical solutions recorded in the foregoing embodiments, or make equivalent replacements of some or all of the technical features, and such modifications or replacements do not depart from the essence of the corresponding technical solutions within the scope of the technical solutions of the embodiments of the disclosure.

What is claimed is:

1. A light emitting diode comprising:

a substrate and a semiconductor light emitting stack layer, wherein the semiconductor light emitting stack layer is disposed on the substrate, the substrate has four sidewalls, an upper surface, and a lower surface, at least one of the four sidewalls is provided with a first laser dotting region and a second laser dotting region, the first laser dotting region comprises a plurality of first laser dots, the second laser dotting region comprises a plurality of second laser dots, and a stress crack is present between the first laser dotting region and the second laser dotting region, wherein a first distance D1 is present between the first laser dotting region and the stress crack, a second distance D2 is present between the second laser dotting region and the stress crack, and $0.7D2<D1<1.3D2$.

2. The light emitting diode according to claim 1, wherein the four sidewalls of the substrate are two difficult-to-crack sidewalls and two easy-to-crack sidewalls, the difficult-to-crack sidewall is adjacent to the easy-to-crack sidewall, a spacing between the plurality of first laser dots on the difficult-to-crack sidewall is smaller than a spacing between the plurality of first laser dots on the easy-to-crack sidewall, and a spacing between the plurality of second laser dots on the difficult-to-crack sidewall is smaller than a spacing between the plurality of second laser dots on the easy-to-crack sidewall.

3. The light emitting diode according to claim 2, wherein the stress crack is located on the easy-to-crack sidewall, and the first distance D1 and the second distance D2 on the easy-to-crack sidewall satisfy the following condition: $0.7D2<D1<1.3D2$.

4. The light emitting diode according to claim 2, wherein, viewed from above the light emitting diode toward the substrate, the substrate has long side edges and short side edges, the easy-to-crack sidewalls are located at the long side edges, and the difficult-to-crack sidewalls are located at the short side edges.

5. The light emitting diode according to claim 2, wherein projections of the plurality of first laser dots on a horizontal plane do not overlap with projections of the plurality of second laser dots on the horizontal plane.

6. The light emitting diode according to claim 1, wherein the first laser dotting region is closer to the upper surface of the substrate than the second laser dotting region, and both the first laser dotting region and the second laser dotting region are parallel to the upper surface or the lower surface of the substrate.

7. The light emitting diode according to claim 6, wherein the first laser dotting region has a first expansion crack extending from the first laser dot toward the upper surface and the lower surface of the substrate, the second laser dotting region has a second expansion crack extending from the second laser dot toward the upper surface and the lower surface of the substrate, and extension ends of the first expansion crack extending toward the lower surface and the second expansion crack extending toward the upper surface end at the stress crack.

8. The light emitting diode according to claim 7, wherein at least one of the four sidewalls is only provided with the first laser dotting region and the second laser dotting region, the first expansion crack extending toward the upper surface does not reach the upper surface of the substrate, and the second expansion crack extending toward the lower surface reaches the lower surface of the substrate.

9. The light emitting diode according to claim 6, wherein a third distance D3 is present between the first laser dotting region and the upper surface of the substrate, a fourth distance D4 is present between the second laser dotting region and the lower surface of the substrate, and D3 is greater than D4.

10. The light emitting diode according to claim 1, wherein $0.9D2<D1<1.1D2$.

11. The light emitting diode according to claim 1, further comprising a first electrode and a second electrode, wherein the semiconductor light emitting stack layer comprises a first semiconductor layer, a light emitting layer, and a second semiconductor layer sequentially stacked on the substrate, the first electrode is electrically connected to the first semiconductor layer, and the second electrode is electrically connected to the second semiconductor layer.

12. The light emitting diode according to claim 1, wherein an edge length of at least one edge of the light emitting diode is less than or equal to 250 μm.

13. The light emitting diode according to claim 1, wherein the substrate has a thickness H1, and $50\ \mu m \leq H1 \leq 200\ \mu m$.

14. The light emitting diode according to claim 1, wherein the substrate is a sapphire substrate.

15. A light emitting device comprising the light emitting diode according to claim 1.

* * * * *